(12) United States Patent
Roy et al.

(10) Patent No.: US 8,673,820 B2
(45) Date of Patent: Mar. 18, 2014

(54) METHOD OF QUALIFYING NIOBIUM AND/OR OTHER SUPER CONDUCTING MATERIALS FOR RELIABLE FABRICATION OF SUPERCONDUCTING RADIO FREQUENCY (SCRF) CAVITIES

(75) Inventors: Sindhunil Barman Roy, Indore (IN); Vinod Chandra Sahni, Indore (IN)

(73) Assignee: Department of Atomic Energy, Mumbai (IN)

( * ) Notice: Subject to any disclaimer, the term of this patent is extended or adjusted under 35 U.S.C. 154(b) by 1590 days.

(21) Appl. No.: 11/978,163

(22) Filed: Oct. 26, 2007

(65) Prior Publication Data

US 2011/0183854 A1    Jul. 28, 2011

(51) Int. Cl.
*H01L 39/24* (2006.01)
(52) U.S. Cl.
USPC ............................. 505/310; 29/599; 148/668
(58) Field of Classification Search
USPC ........ 505/210, 310; 333/99 S, 21 R, 202, 208, 333/227, 235, 239; 315/4, 3.5, 5.41; 148/96, 668, 422
See application file for complete search history.

(56) References Cited

U.S. PATENT DOCUMENTS 3,784,452 A * 1/1974 Martens et al. ................. 205/51
3,906,412 A * 9/1975 Meyerhoff ................... 333/99 S

OTHER PUBLICATIONS

Myneni, "Niobium Specifications and Performance of SRF Cavities," APAC 2007 SRF Mini Work Shop, Indore, India, Jan. 28, 2007, pp. 1-36.*
Casalbuoni et al, "Surface superconductivity in niobium for superconducting RF cavities," Nuclear Instruments and Methods in Physics Research, Section-A, Elsevier, 2008, 538, pp. 45-64.*
Aizaz et al, "Thermal Limitations in Superconducting RF Cavities: Improved Heat Transfer at Niobium-Helium Interface," C2-0-06 presented at 2005 CEC/ICMC Key Stone, Colarado, USA, Advances in Cryoengineering, pp. 1-8.*

* cited by examiner

*Primary Examiner* — Stanley Silverman
*Assistant Examiner* — Kallambella Vijayakumar
(74) *Attorney, Agent, or Firm* — Ladas & Parry LLP

(57) ABSTRACT

A method of qualifying Niobium and/or other super conducting materials for the reliable fabrication of SCRF cavities, which will invariably deliver high accelerating fields including: identification of the best superconducting lower critical field ($H_{C1}$) based on subjecting a sample of the superconducting material selectively to mechanical stress, annealing at various temperatures, various chemical treatments, post-chemical treatment baking/annealing; and identification of the best possible thermal conductivity of the material at said best superconducting lower critical field ($H_{C1}$) to thereby qualify the superconducting material for the reliable fabrication of SCRF cavities adapted to deliver high accelerating fields.

10 Claims, 2 Drawing Sheets

Figure 1:
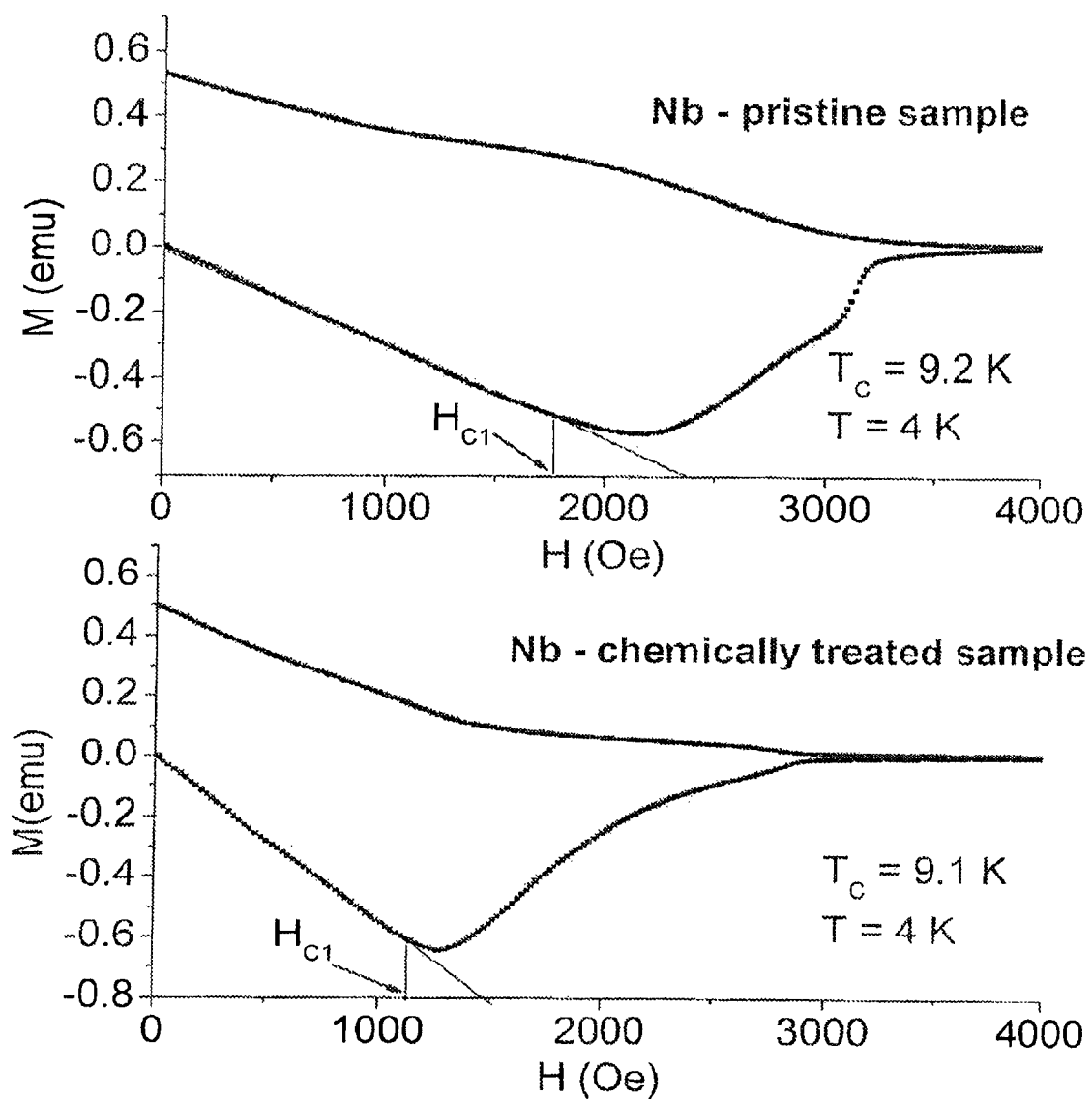

METHOD OF QUALIFYING NIOBIUM AND/OR OTHER SUPER CONDUCTING MATERIALS FOR RELIABLE FABRICATION OF SUPERCONDUCTING RADIO FREQUENCY (SCRF) CAVITIES

FIELD OF THE INVENTION

The present invention relates to a new method of qualifying Niobium and other superconducting materials for the purpose of fabrication of superconducting radio frequency (SCRF) cavities and, in particular, to a method of qualifying Niobium and other super conducting materials for the reproducible production of SCRF-cavities directed to achieving high accelerating gradients. Importantly, the method of the invention would facilitate building SCRF-cavities for charge particle accelerator involving high accelerating fields (or gradient) such as above a few tens of Mega volts per meter (MV m$^{-1}$). Advantageously, the method of the invention, directed towards qualifying Niobium and other super conducting materials would avoid the limitation and disadvantages of presently known qualification processes of SCRF cavity materials which are mainly based on enhancing the residual resistivity ratio (RRR) of the Niobium and other super conducting materials through various kinds of material treatments. The invention would, therefore, facilitate the desired cost-effective and user friendly manner of ensuring reliable fabrications of SCRF cavities, which will invariably deliver high accelerating fields.

BACKGROUND ART

In the radio frequency field based electron, proton and ionized particle accelerators involving continuous wave or long-pulse duration beams, and accelerating fields (or gradient) above a few million volts per meter (MV m$^{-1}$), SCRF cavities bring various advantages over the conventional copper cavities. As a result, in recent years, SCRF accelerating structures are being deployed in various high energy accelerators all over the world.

Most SCRF cavities currently used are based on Niobium (Nb). The quality of SCRF cavities depend to a very great extent on the material characteristics.

Cold test studies of certain Niobium SCRF cavities have shown that these cavities sustained an electric field gradient in the range of 26-35 MV/m. Such range of electric gradient corresponds to magnetic field (experienced by the SC-RF cavity surface) in the range of 1.0 to 1.6 kOe.

U.S. Patent Application 20060219336 discloses Niobium cavities, which are fabricated by the drawing and ironing of as cast niobium ingot slices rather than from cold rolled niobium sheet. This method results in the production of niobium cavities having a minimum of grain boundaries at a significantly reduced cost as compared to the production of such structures from cold rolled sheet.

U.S. Pat. No. 4,857,360 teaches a process for the manufacture of superconducting cavity resonators with improved surface quality, whereby even complex shaped cavity resonators can be made with cavities coated with NbN.

U.S. Pat. No. 7,151,347 discloses a niobium cavity exhibiting high quality factors at high gradients. This is achieved by treating a niobium cavity through a process comprising: 1) removing surface oxides by plasma etching or a similar process; 2) removing hydrogen or other gases absorbed in the bulk niobium by high temperature treatment of the cavity under ultra high vacuum to achieve hydrogen outgassing; and 3) assuring the long term chemical stability of the niobium cavity by applying a passivating layer of a superconducting material having a superconducting transition temperature higher than niobium thereby reducing losses from electron scattering in the near surface region of the interior of the niobium cavity. According to a preferred embodiment, the passivited layer comprises niobium nitride (NbN) applied by reactive sputtering.

While the above state of the art reveal the importance attached to the fabrication of SCRF-cavities for high accelerating gradient, importantly, the qualification process of such SCRF cavity material is now solely based on the enhancing of the residual resistivity ratio (RRR) of the Niobium through various kinds of material treatments.

Importantly, with high residual resistivity ratio (RRR>300) Niobium as the starting material, the existing techniques of SCRF "cavity fabrication" and "cavity surface treatment" have successfully taken care of extrinsic effect like electron-loading, multipacting, Q-disease etc. However, it remains a matter of fact that all the SCRF cavities fabricated with the same process do not always deliver high accelerating fields. This leads to a lot of wasted effort and materials. Therefore, there is a continuing need to develop suitable material qualification scheme, which would ensure that most, if not all, of the fabricated cavities deliver high accelerating fields.

Moreover, there is no method of SCRF cavity material qualification involving the determination of the magnetic field limit of the Niobium SCRF cavities prior to cavity fabrication procedure. Thus the presently known processes of qualifying such super conducting materials through residual resistivity ratio are not adapted to facilitate reliable achievement of the highest possible peak RF-magnetic field $H_{peak}$ in the SCRF accelerating cavities.

Due to the above limitations of the conventional method of qualifying Niobium materials the same also lead to wastage of the Niobium materials because there is no possibility of choosing the right and properly qualified Niobium materials which would favour the desired reproducible production of the SC-RF cavities and thereby improve the efficacy and yield of such cavity fabrication process.

Also, the present methods for qualifying Niobium and other materials for the production of SCRF-cavities do not take account of any possible influence of the thermal, mechanical and chemical treatment on the magnetic field limit of SCRF cavity material.

OBJECTS OF THE INVENTION

It is thus the basic object of the present invention to provide a method of qualifying Niobium and other super conducting materials including $MgB_2$, $Nb_3Sn$, $Nb_3Al$ and Mo—Re alloys etc. for the reliable fabrication of SCRF cavities adapted to deliver high accelerating fields, which would not be limited to fabrication based on high residual resistivity ratio (RRR) and would avoid the aforediscussed limitations of such high RRR based qualifying processes of SCRF cavity materials.

Another object of the present invention is directed to a method of qualifying Niobium and other superconducting materials, which would ensure to a greater extent that most, if not all, of the SCRF cavities fabricated with such qualified samples of superconducting materials would invariably deliver high accelerating fields such as above a few tens of Mega volts per meter (MV m$^{-1}$).

A further object of the present invention is directed to a method of qualifying Niobium and other super conducting materials for the reliable fabrication of SCRF cavities adapted to deliver high accelerating fields which would meet the much required need to save lot of wasted efforts and materials in fabrications of such cavities.

Another object of the present invention is directed to a method of qualifying Niobium and other super conducting materials for the reliable fabrication of SCRF cavities adapted to deliver high accelerating fields which would take into account the crucial role of the super conducting critical fields $H_{CI}$ and also to a certain extent of thermal conductivity in the SCRF cavity materials qualification process.

Yet another object of the present invention is directed to a method of qualifying Niobium and other superconducting materials based on evaluation of these materials on the basis of the superconducting lower critical fields ($H_{CI}$), thermal conductivity and identifying recipes which could lead to maximizing $H_{CI}$ and thermal conductivity after subjecting these materials to selective mechanical, thermal and chemical treatment usually involved in standard cavity processing.

A further object of the present invention is directed to a method of qualifying Niobium and other super conducting materials which would prevent the wastage of Niobium/superconducting materials and efforts by enabling identification of the right and properly qualified Niobium and other superconducting materials, which would assure reproducible production of SC-RF cavities and importantly greatly increase the yield of the cavity fabrication process.

SUMMARY OF THE INVENTION

Thus according to the basic aspect of the present invention there is provided a method of qualifying Niobium and/or other super conducting materials for the reliable fabrication of superconducting RF-cavities, which would invariably deliver high accelerating fields comprising:

optimization of the superconducting lower critical field ($H_{C1}$) based on subjecting a sample of the superconducting material selectively to mechanical stress, annealing at various temperatures, various chemical treatments, post-chemical treatment like baking/annealing; and identifying the best possible thermal conductivity of the material at the optimized superconducting lower critical field ($H_{C1}$) so as to qualify the superconducting material for the reproducible fabrication of superconducting cavities adapted to deliver high accelerating fields.

In accordance with a preferred aspect of the present invention there is provided a method of qualifying niobium and other super conducting materials comprising of the following steps:

(i) measuring the $H_{C1}$ and thermal conductivity on a small sample of the said superconducting material obtained from a pure but untreated ingot which could be anyone of Niobium, MgB2, Nb3Sn, Nb3Al and Mo—Re alloys;

(ii) subjecting the sample to mechanical stress and noting the variations/effects thereof, if any, on the $H_{C1}$;

(iii) annealing the sample at various temperatures and noting the changes (if any) in the $H_{C1}$ and determine the best annealing treatment for improving the $H_{C1}$;

(iv) subjecting the sample to various chemical treatments and noting the variations in the $H_{C1}$;

(v) subjecting the chemically treated sample to baking/annealing and noting the variations in the $H_{C1}$ and if possible improving it through baking/annealing cycles;

(vi) measuring the thermal conductivity with the best identified $H_{C1}$ and improving the thermal conductivity with suitable heat treatment if possible without degrading the $H_{C1}$.

In accordance with yet another aspect of the present invention there is provided the method of qualifying niobium and other super conducting materials wherein the various steps are repeated for sample from the top, bottom and middle of the mother ingot to determine the best qualifying procedure for the superconducting material.

In the above method for qualifying niobium and other super conducting materials the said step of chemical treatment of the sample comprises selected chemical treatments including BCP (buffer chemical polishing) or EP (electro polishing).

In accordance with an aspect of the invention the said $H_{C1}$ is estimated based on determination of the "first penetration" of magnetic field into the niobium and other superconducting samples.

Preferably, the said estimation of $H_{C1}$ according to the invention comprises:

measuring the isothermal field dependent magnetization of superconducting sample at various temperatures below the superconducting transition temperature;

establishing the magnetic field at which the deviation from linearity starts in the isothermal magnetization versus magnetic field plot for an initial estimate of the HC1; and estimation for more precise value of $H_{C1}$ which is the field value at which $\sqrt{M_{rem}}=0$ in the isothermal $\sqrt{M_{rem}}$ versus magnetic field plot wherein $M_{rem}$ stands for the remnant magnetization (or trapped magnetic field) in the sample after a field excursion in an applied magnetic field H.

In accordance with yet another preferred aspect of the invention, in the said method of qualifying niobium and other super conducting materials:

a small sample of niobium is heat treated at suitable temperatures for the strain recovery in the sample but avoiding nucleation and grain growth;

subsequent to the thermal treatment and measurement of $H_{C1}$ mentioned above, the small sample of Nb (with optimized $H_{C1}$) is subjected to various chemical treatments like BCP and/or EP to check the effect of such chemical treatments on the $H_{C1}$ so as to find the most suitable chemical treatment, which retains or even further improves the optimized $H_{C1}$.

After the above mentioned chemical treatments, to achieve optimized $H_{C1}$ the sample is again heat treated for degassing of hydrogen, and a suitable heat treatment routine is established; and the thermal conductivity is measured in zero and applied magnetic fields upto HC1 at 2K and 4.5K.

Importantly, in the above method of qualifying niobium and other super conducting materials the said step of measuring thermal conductivity is repeated after annealing at various temperatures and the optimal heat treatment is established to obtain the best thermal conductivity.

In the instance the said estimated $H_{C1}$ is found to be smaller than that obtained after said step of chemical treatment, the steps (a), (viz. of measuring the thermal conductivity in zero and applied magnetic fields up to $H_{C1}$ at 2K and 4.5K) (b) (viz. of measuring thermal conductivity after heating at various temperatures and the optimal heat treatment for obtaining the best thermal conductivity is established) and (c) (viz. of measuring the $H_{C1}$ of the sample with highest thermal conductivity) are repeated until the sample has the best combination of $H_{C1}$ and thermal conductivity.

Importantly, for each said samples from the top, bottom and middle part of the ingot are subjected to the same said steps such as to optimize the chemical, mechanical and thermal treatment directed to achieve the best $H_{C1}$ and thermal conductivity values.

It would be apparent from the above that the method of qualifying Niobium and other materials (for production of SCRF-cavities with high accelerating gradients) of the present invention, which involves a qualifying procedure for SCRF cavity materials involving measurement of superconducting critical magnetic fields is directed to ensure that most, if not all, of the fabricated SCRF cavities deliver the high accelerating fields, as per the goal of SCRF cavity. Thus, the above process of the invention would take care of the limitation of the known material qualification scheme (based on only the high residual resistivity ratio (RRR>300)) of Niobium as the starting material for super SCRF cavity fabrication. The preferred aspect of the invention is that it would ensure that most of the fabricated SCRF cavities deliver the high accelerating fields reproducibly as per the SC-RF cavity design.

It has been observed at Jefferson Lab. USA through cold tests on various Niobium SCRF cavities that such cavities regularly sustained an electric field gradient in the range of 26-35 MV/m. This range of electric field gradient corresponds to magnetic field (experienced by the SC-RF cavity surface) in the range of 1.0 to 1.6 kOe. The studies under the present invention have established that the lower critical fields of the Niobium samples used in such SC-RF cavity fabrication actually lies in the same magnetic field range. The present process of the invention advantageously facilitates determining the magnetic field limit of the Niobium SC-RF cavities before the start of the cavity fabrication procedure itself. Also, the process would prevent the wastage of Niobium materials and efforts by way of providing for choosing the right and properly qualified Niobium and other superconducting materials having the best combination of super conducting critical field $H_{CI}$ and thermal conductivity which in turn would ensure the much desired reproducible production of the SCRF cavities performing at par with the cavity design and also greatly enhance the yield of cavity fabrication process.

Moreover, the above disclosed process of qualifying Niobium and other materials for production of SCRF cavities with high accelerating gradients by ensuring that most, if not all, of the fabricated cavities deliver high accelerating fields would avoid the problem of wasted efforts and materials generally involved in by following the existing art based solely on the residual resistivity ratio of the Niobium material.

Advantageously, therefore the present invention, for the first time provides a qualifying process for Niobium and other super conducting materials, which paves the way for reliable production of SCRF cavity with high accelerating gradients by way of involving the crucial role of super conducting critical field $H_{CI}$ and also to a certain extent thermal conductivity in the qualification process of Niobium and other superconducting materials.

In accordance with yet another aspect of the invention, there is provided a crucial part of SC-RF cavity fabrication procedure involving Niobium or other superconducting materials to deliver high accelerating fields comprising:

(a) method of qualifying the suitable Niobium and other superconducting materials comprising
  (i) identifying the best superconducting lower critical field ($H_{C1}$) based on subjecting a sample of the superconducting material selectively to mechanical stress, annealing at various temperatures, various chemical treatments, post-chemical treatment baking/annealing; and
  (ii) identifying the best possible thermal conductivity of the material at said best superconducting lower critical field ($H_{C1}$) to thereby qualify the superconducting material for the reliable fabrication of superconducting cavities, which will invariably deliver high accelerating fields; and (b) subjecting the Niobium or other superconducting materials (of which the sample is successfully qualified in step (a)) to processing steps identified during said qualifying for retaining the desired combination of highest attainable $H_{C1}$ and thermal conductivity, to thereby favour reproducibly fabricating SCRF cavities capable of delivering high accelerating fields.

Thus, the method for the qualification of Niobium and other superconducting materials of the invention (which is based on evaluation of the Niobium and other superconducting materials on the basis of the super conducting lower critical field ($H_{CI}$) and thermal conductivity, which in turn also facilitates identifying recipes which could lead to maximizing $H_{CI}$ and thermal conductivity after subjecting the material to various mechanical, thermal and chemical treatment usually involved in cavity processing) will pave the way for reproducibly fabricating SCRF cavities delivering high gradients.

The process of qualifying Niobium and other super conducting materials according to the invention will thus be useful in reproducibly achieving highest possible peak RF-magnetic field $H_{peak}$ in the SC-RF accelerating cavities. The selective material qualification process of the invention will be more effective than the existing qualifying process of Niobium material through RRR and will ensure that most fabricated SC-RF cavities give high accelerating gradients. The above process for qualifying Niobium materials for such cavity fabrication can be systematically extended even to other materials like $MgB_2$, $Nb_3Sn$, $Nb_3Al$ and Mo—Re alloys in an analogous manner.

The details of the invention, its objects and advantages are explained hereunder in greater detail in relation to non-limiting exemplary illustrations of such method of qualifying Niobium material in accordance with the invention and in relation to the following accompanying figures:

BRIEF DESCRIPTION OF THE ACCOMPANYING FIGURES

FIG. 1: Shows the isothermal field variation of magnetization in two different samples of Niobium—one pristine sample and other a buffer chemical polished sample, measured at 4K; and FIG. 2: Shows the isothermal field variation of magnetization of a $MgB_2$ sample with 50 micron grain size, measured at T=15K.

EXAMPLE

The method of material qualification involving systematic measurement of super conducting lower critical field ($H_{CI}$) of samples of Niobium obtained from the mother Niobium ingot for use for SC-RF cavity fabrication in accordance with the present invention was carried out following the steps as discussed hereunder.

The method of the invention, involving obtaining $H_{CI}$, is based on finding the "first penetration" of magnetic field into the super conducting Niobium sample. This was done by measuring the isothermal field dependent magnetization of super conducting Niobium sample at various temperatures below the super conducting transition temperature. $H_{CI}$ was then deduced as follows:

The magnetic field was established, at which the deviation from linearity started in the isothermal magnetization versus magnetic field plot. This provided a good initial estimation of $H_{CI}$. More precise value of $H_{CI}$ was determined by using the extrapolation, method that is the field value at which $\sqrt{M_{rem}}=0$ in the isothermal $\sqrt{M_{rem}}$ versus magnetic field plot. Here $\sqrt{M_{rem}}$ stands for the remnant magnetization (or trapped magnetic field) in the sample after a field excursion in an applied magnetic field H.

The method of qualifying, involving the above measure of $H_{CI}$, was carried out through the following steps executed in a systematic manner:

(a) The $H_{CI}$ and thermal conductivity were first measured on a small Niobium sample, scooped out of a pure but untreated Niobium ingot;

(b) thereafter the sample was subjected to mechanical stress and the variation (if any) in the $H_{CI}$ was checked. From this it could be inferred what are the effects (if any) of the mechanical stress on the $H_{CI}$ of Niobium;

(c) the same sample was annealed at various temperatures to improve the $H_{CI}$. From this it could be inferred how the $H_{CI}$ changes for the small samples of Niobium heat treated at various temperatures. (Under this step the small sample of Niobium must be heat treated at suitable temperature for strain recovery in the sample, but avoiding nucleation and grain growth);

(d) the variation in the $H_{CI}$ with various chemical treatments like BCP or EP was checked and the $H_{CI}$ was remeasured. In this step for the smoothening of the surface of the Niobium sample (accomplished by buffer chemical polishing or electro polishing), each surface treatment must be followed by the estimation of $H_{CI}$ following steps as already detailed hereinbefore;

(e) the variation in the $H_{CI}$ with post chemical treatment baking/annealing was checked and if possible, the $H_{CI}$ was still further improved. In the execution of such post chemical treatment, like annealing, the small sample of Niobium at suitable temperature for degassing of hydrogen (accumulated in the sample during chemical treatment), must be followed by the estimation of the $H_{CI}$ following steps as already detailed hereinbefore;

(f) thermal conductivity of the sample with best $H_{CI}$ was measured and suitable heat treatment procedure for improving thermal conductivity, but without degrading $H_{CI}$, was established. Such stage include (a) measuring the thermal conductivity in zero and applied magnetic fields upto $H_{CI}$ at 2K and 4.5K. (b) repeating such step of measuring the thermal conductivity after heat treating the sample at various temperatures and (c) establishing the optimum heat treatment for obtaining the best thermal conductivity. Finally the $H_{CI}$ of the sample with highest thermal conductivity was measured following steps as already detailed hereinbefore. If the estimated $H_{CI}$ was found to be smaller than that obtained after the step of annealing, the steps (a) to (c) were repeated until the sample attained the best combination of $H_{CI}$ and thermal conductivity;

(g) the steps (a)-(f) above were repeated for three more small samples of Niobium from top, bottom and middle of the mother ingot and finally the best processing sequence was established. This enabled optimizing the chemical, mechanical and thermal treatment to achieve the best $H_{CI}$ and thermal conductivity values.

Following the above steps of qualification, some exemplary studies were carried out to identify the isothermal field variation of magnetization in two different samples of Niobium, one pristine sample and other a buffer chemical polished sample, measured at 4K. The $H_{CI}$ values in the pristine sample and the chemically treated sample were noted and results obtained are illustrated in accompanying FIG. 1. As apparent from the FIG. 1, the experimentally obtained $H_{CI}$ in the pristine sample was larger than the $H_{CI}$ of the chemically treated sample.

Figure 2:
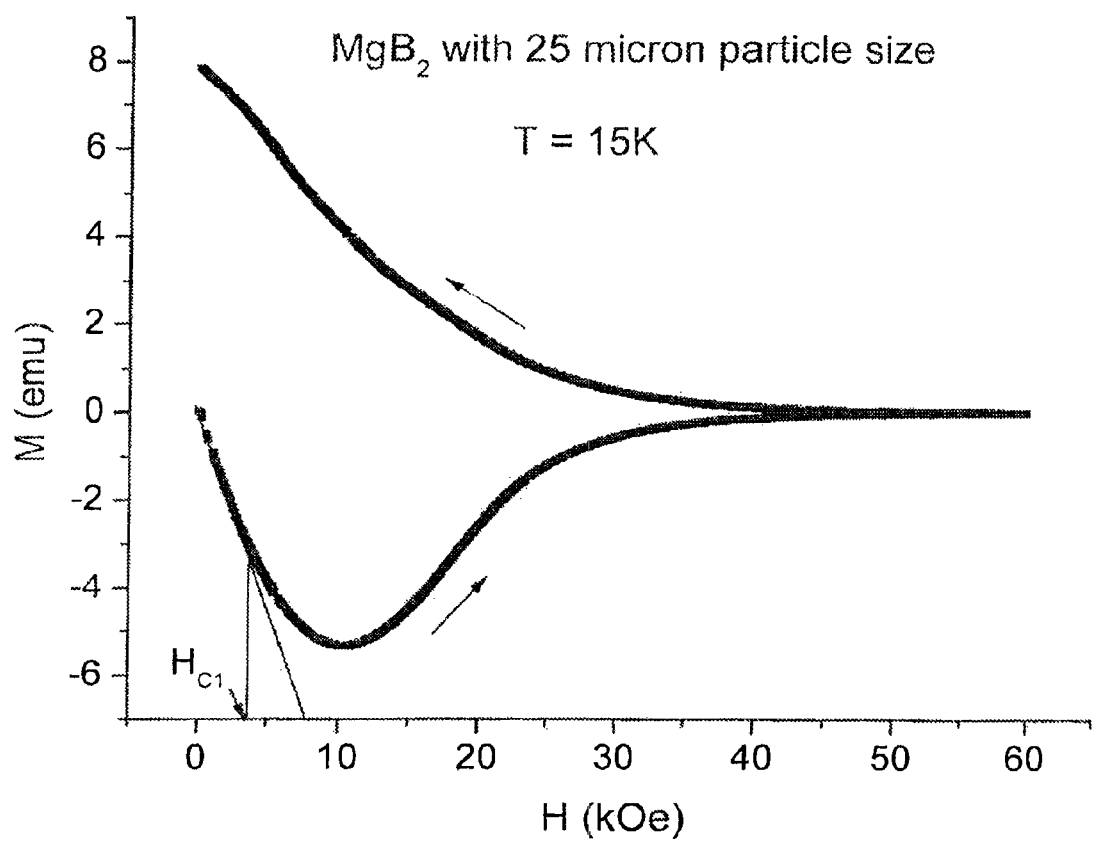

Additionally, the isothermal field variation of magnetization of a $MgB_2$ sample with 50 micron grain size, measured at T=15K was studied and the results are shown in accompanying FIG. 2. The estimated value of $H_{C1}$ was found to be about 4 kOe.

The above studies clearly reveal the crucial role of the super conducting critical field $H_{CI}$ in the characterization of Niobium material, which the above disclosed process of qualification of the invention embodies.

Thus, the method of qualifying Niobium and other super conducting materials which do not rest on the residual resistivity ratio (RRR) but takes into account the relevance of super conducting critical field ($H_{CI}$) and thermal conductivity would be useful in reproducibly achieving the highest possible peak RF-magnetic field $H_{peak}$ in the SC-RF accelerating cavities. As already discussed the process of qualification of Niobium of the invention can be extended to other super conducting material such as $MgB_2$, $Nb_3Sn$, $Nb_3Al$ and Mo—Re alloys in an analogous manner.

We claim:

1. A method of qualifying niobium and/or other super conducting materials suitable for the reliable fabrication of SCRF cavities, which will invariably deliver the desired high accelerating field corresponding to the respective superconducting material comprising:
   identification of both the best superconducting lower critical field $H_{C1}$ and the best thermal conductivity at the best superconducting lower critical field $H_{C1}$ based on systematic measurement of super conducting lower critical field $H_{C1}$ and the thermal conductivity of a sample of said material by subjecting the sample of the superconducting material to treatments in a systematic manner by
   (i) measuring the $H_{C1}$ and thermal conductivity on a small sample obtained from a pure but untreated ingot of the niobium and/or other super conducting materials;
   (ii) subjecting the sample to mechanical stress and noting the variations/effects thereof if any, in the $H_{C1}$;
   (iii) annealing the sample at various temperatures and noting the changes in the $H_{C1}$ and determine if possible manner of improving the $H_{C1}$;
   (iv) subjecting the sample to chemical treatments and noting the variations in the $H_{C1}$;
   (v) subjecting the chemically treated sample to baking/annealing and noting the variations in the $H_{C1}$ and improving the same if possible;
   (vi) measuring the thermal conductivity with the best identified $H_{C1}$ and improving the thermal conductivity with suitable heat treatment if possible without degrading the $H_{C1}$.

2. The method of qualifying niobium and other super conducting materials according to claim 1 wherein the sample comprises:
   a small sample of the superconducting material obtained from a pure but untreated ingot selected from any one of niobium, $MgB_2$, $Nb_3Sn$, $Nb_3Al$ and Mo—Re alloys.

3. The method of qualifying niobium and other super conducting materials according to claim 1 wherein steps (i)-(vi) are repeated for sample from the top, bottom and middle of the untreated ingot for determination of the best qualifying procedure for the superconducting material.

4. The method of qualifying niobium and other super conducting materials according to claim 1 wherein said step of chemical treatment of the sample comprises selective chemical treatments including BCP or EP.

5. The method of qualifying niobium and other super conducting materials according to claim 1 wherein said $H_{C1}$ is estimated based on determination of the first penetration of magnetic field into the superconducting niobium sample.

6. The method of qualifying niobium and other super conducting materials according to claim 5 comprising measuring the isothermal field dependent magnetization of superconducting sample at various temperatures below the superconducting transition temperature; establishing the magnetic field at which the deviation from linearity starts in the isothermal magnetization versus magnetic field plot for an initial estimate of the $H_{C1}$; and estimation of extrapolated value of $H_{C1}$ which is the field value at which $\sqrt{M_{rem}}=0$ in the isothermal $\sqrt{M_{rem}}$ versus magnetic field plot wherein $\sqrt{M_{rem}}$ stands for the remnant magnetization or trapped magnetic field in the sample after a field excursion in an applied magnetic field H.

7. The method of qualifying niobium and other super conducting materials according to claim 1 wherein
   in step (iii) a small sample of niobium is heat treated at suitable temperatures for the strain recovery in the sample but avoiding nucleation and grain growth;
   in step (iv) for the smoothening of the surface of the niobium sample involving buffer chemical polishing or electro polishing, each surface treatment is followed by said estimation of the $H_{C1}$;
   in step (v) in carrying out the post chemical-treatment annealing, the small sample of niobium is heat treated at suitable temperatures for degassing of Hydrogen, which is then followed by said estimation of the $H_{C1}$; and
   in step (vi) the thermal conductivity is measured in zero and applied magnetic fields up to $H_{C1}$ at 2K and 4.5K.

8. The method of qualifying niobium and other super conducting materials according to claim 7 wherein the step of measuring thermal conductivity is repeated after heating at various temperatures and the optimal heat treatment for obtaining the best thermal conductivity is established.

9. The method of qualifying niobium and other super conducting materials according to claim 1 wherein, in the instance said $H_{C1}$ is found to be smaller than that obtained after said step (v), the following steps are repeated until the sample has the best combination of $H_{C1}$ and thermal conductivity:
   (a) measuring the thermal conductivity in zero and applied magnetic fields upto $H_{C1}$ at 2K and 4.5K,
   (b) measuring thermal conductivity after heating at various temperatures and the optimal heat treatment for obtaining the best thermal conductivity is established, and
   (c) measuring the $H_{C1}$ of the sample with highest thermal conductivity.

10. The method of qualifying niobium and other super conducting materials according to claim 3 wherein for each said samples from the top, bottom and middle part of the untreated ingot are subjected to same said steps to optimize the chemical, mechanical and thermal treatment directed to achieve the best $H_{C1}$ and thermal conductivity values.

* * * * *